United States Patent
Berg

(10) Patent No.: US 10,150,525 B2
(45) Date of Patent: Dec. 11, 2018

(54) TESTING ARRANGEMENT FOR TESTING AT LEAST ONE CONNECTION INTERFACE AND METHOD FOR TESTING AT LEAST ONE CONNECTION INTERFACE WITH A TESTING ARRANGEMENT

(71) Applicant: GM GLOBAL TECHNOLOGY OPERATIONS LLC, Detroit, MI (US)

(72) Inventor: Matthias Berg, Ruesselsheim (DE)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 161 days.

(21) Appl. No.: 15/223,173

(22) Filed: Jul. 29, 2016

(65) Prior Publication Data
US 2017/0029051 A1 Feb. 2, 2017

(30) Foreign Application Priority Data
Aug. 1, 2015 (DE) .................. 10 2015 010 042

(51) Int. Cl.
*G06F 19/00* (2018.01)
*B62D 65/00* (2006.01)
(Continued)

(52) U.S. Cl.
CPC ........... *B62D 65/005* (2013.01); *G01R 31/00* (2013.01); *G05B 23/0208* (2013.01);
(Continued)

(58) Field of Classification Search
CPC .............................................. G05B 19/41875
(Continued)

(56) References Cited

U.S. PATENT DOCUMENTS 4,922,191 A * 5/1990 Conover .................. G01R 1/04
324/750.19
5,966,023 A * 10/1999 Burgers ............... G01R 1/0416
324/750.25
(Continued)

FOREIGN PATENT DOCUMENTS

EP  0902509 A1  3/1999
EP  2075881 A1  7/2009
(Continued)

OTHER PUBLICATIONS

Sergej Ivanov, Electrical connection system for e.g. mechanical engineering, has locking device that is relocatable opposite to connector part along insertion axis and is relocatable in partial area of insertion path with respect to another connector part, DE102006021841A1, Feb. 19, 2009, pp. 7 (English translation).*
(Continued)

*Primary Examiner* — Suresh Suryawanshi
(74) *Attorney, Agent, or Firm* — Lorenz & Kopf, LLP

(57) ABSTRACT

A testing device is disclosed for testing a connection interface coupled onto an assembly line between first and second vehicle components. The testing device includes a tool configured to couple the connection interface, at least one test adapter for testing the coupling of the connection interface, and a sensor device for acquiring a force progression which acts during and/or after the coupling in the connection interface. The testing device also includes an evaluation device to evaluate the force progression.

15 Claims, 6 Drawing Sheets

(51) Int. Cl.
  *G05B 23/02* (2006.01)
  *G06Q 30/00* (2012.01)
  *G01R 31/00* (2006.01)
(52) U.S. Cl.
  CPC ....... *G05B 23/0218* (2013.01); *G06Q 30/018* (2013.01); *G05B 2219/32368* (2013.01)
(58) Field of Classification Search
  USPC ........................................................ 700/110
  See application file for complete search history.

(56) References Cited

U.S. PATENT DOCUMENTS

| | | | |
|---|---|---|---|
| 8,392,764 B2* | 3/2013 | de Buen | H04L 41/12 |
| | | | 714/44 |
| 9,089,892 B2 | 7/2015 | Bloecher | |
| 9,375,840 B2* | 6/2016 | Naderer | B25J 9/1633 |
| 9,689,895 B2* | 6/2017 | Dowhower | G01R 1/0416 |
| 2004/0036273 A1* | 2/2004 | McClary | H01R 13/641 |
| | | | 285/18 |
| 2006/0132119 A1* | 6/2006 | Collins | G01R 31/2889 |
| | | | 324/756.05 |
| 2008/0086246 A1* | 4/2008 | Bolt | G01R 31/007 |
| | | | 701/31.4 |
| 2012/0271581 A1 | 10/2012 | Draht et al. | |
| 2017/0148587 A1* | 5/2017 | Fust | H01H 13/10 |

FOREIGN PATENT DOCUMENTS

| | | |
|---|---|---|
| JP | H06188061 A | 7/1994 |
| JP | H0848271 A | 2/1996 |
| JP | 2014107177 A | 6/2014 |
| KR | 20130065140 A | 6/2013 |
| WO | 2005072917 A1 | 8/2005 |

OTHER PUBLICATIONS

Intellectual Property Office, Great Britain Search Report for Great Britain Application No. GB1611696.4, dated Jan. 20, 2017.
German Patent Office, German Search Report for German Application No. 102015010042.4, dated May 23, 2016.

* cited by examiner

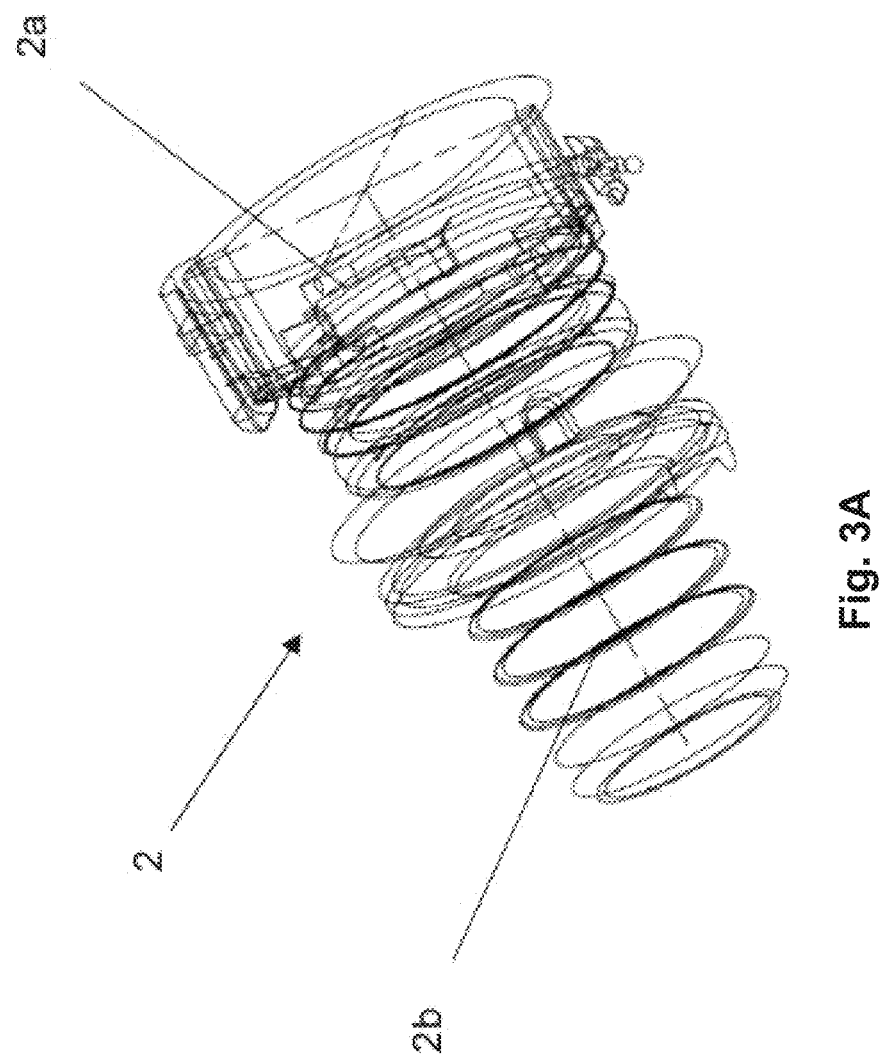

TESTING ARRANGEMENT FOR TESTING AT LEAST ONE CONNECTION INTERFACE AND METHOD FOR TESTING AT LEAST ONE CONNECTION INTERFACE WITH A TESTING ARRANGEMENT

CROSS-REFERENCE TO RELATED APPLICATION

This application claims priority to German Patent Application No. 102015010042.4, filed Aug. 1, 2015, which is incorporated herein by reference in its entirety.

TECHNICAL FIELD

The present disclosure pertains to a testing arrangement for testing at least one connection interface and to a method for testing at least one connection interface with a testing arrangement.

BACKGROUND

Conventional testing stations check a connection status of connecting members that join vehicle components together. For example, JP 2014 107 177 A describes a testing station with first and second cameras, which acquire a connection status of connecting parts, such as connecting cables. The testing station includes an evaluation device, which evaluates the acquired images of the cameras, and transmits them as signals to the control device. Given an incorrect connection status, the control device initiates a line stop.

SUMMARY

The present disclosure elevates the safety of a connection between at least two vehicle components and includes a testing arrangement and a method for testing a connection interface with a testing arrangement. In particular, a testing arrangement is configured for testing at least one connection interface.

In one embodiment, the connection interface is coupled an assembly line between first and second vehicle components. For example, the connection interface may include two interacting quick connector parts, for example snap connector parts. For example, the vehicle components are configured as shift cables of a motor gearbox and/or shifter gearbox of a vehicle, as lines in an engine cooling system and/or in a fuel system of the vehicle. The testing arrangement preferably includes vehicle components of all kinds, e.g., to include trim parts for an interior of the vehicle, which can be coupled and/or are coupled by a quick connector.

The testing device includes a tool. For example, the tool is configured as a gripper, manipulator, or effector of a production robot for coupling the connection interface. In particular, the tool puts together two quick connector parts, so that the first and second vehicle components are coupled with each other.

The testing arrangement includes at least one sensor device configured to acquire a force progression that acts in the connection interface during and/or after the coupling. As an additional option, the testing device includes a measuring amplifier, which amplifies the acquisition and/or measurement of the sensor device. The sensor device, in particular in conjunction with the measuring amplifier, is preferably arranged on the tool, e.g., integrated into a handle of the tool.

The testing device includes at least one test adapter, which is configured to test the coupling of the at least one connection interface, in particular of the two quick connector parts.

The testing arrangement includes an evaluation device and a control device. The evaluation device evaluates the force progression acquired by the at least one sensor device. The evaluation device preferably transmits the acquired force progression as a control signal to the control device. In particular, the control device actuates the assembly line based on the control signal.

It is advantageous that the testing arrangement makes it possible to reduce the risk that the first and second vehicle components will be incorrectly assembled by the connection interface. As a result, defective vehicle gearboxes and leaks in the fuel and/or cooling system of the vehicle can be advantageously avoided. In particular, this enables a savings on maintenance and repair costs. In addition, there is advantageously no need for manual inspections of the at least one connection interface, e.g., for any pulling on the connection and/or a manual documentation, e.g., for applying color markings on the at least one connection interface. This makes it possible to economize on production time and capacities.

In a preferred embodiment of the present disclosure, the test adapter can be arranged on the tool. For example, the test adapter can be arranged on the tool by a threaded or screw connection, or with another quick connector, for example another snap connector. In particular, the test adapter can be removed from the tool without another tool and/or without being destroyed, and replaced by another test adapter. In particular, a test adapter can be allocated to a specific connection interface, which can be used for coupling a corresponding vehicle component. By contrast, another test adapter can be allocated to an additional and different connection interface for coupling additional vehicle components.

It is especially preferred that the tool includes a transmission device, which is configured to mechanically transmit the force progression from the test adapter to the sensor device. In particular, the transmission device transmits the force progression from the test adapter to the sensor device. The transmission device preferably connects the sensor device arranged on the tool with the test adapter placed on the tool. For example, the transmission device is configured as a transmission rod. As a result, the sensor device integrated into the tool can interact with the test adapter arranged on the tool, and acquire the force progression during the coupling of the connection interface.

It is further advantageously achieved that the sensor device only has to be installed in the tool one time, and each test adapter need not be equipped with its own sensor device. This is advantageous in particular when switching between several test adapters for testing various interface devices and/or vehicle components, since the component costs for the test adapter can be economized. In an alternative configuration, the sensor device can also be arranged on the test adapter, in particular integrated therein. In this case, the transmission device can be done without.

In a preferred implementation of the present disclosure, the sensor device is configured as a spring body force transducer for acquiring a force-path progression. A spring body, e.g., which includes a strain gauge, is elastically deformed through exposure to a force. The deformation alters an electrical resistance, which is converted into a change in an electrical voltage, and from which the force-path progression can be calculated.

As an alternative or additional option, the sensor device is configured as a piezo force transducer for acquiring a force-path progression acting in the connection interface. In piezoelectric force transducers, a directed deformation of the piezoelectric material causes microscopic dipoles to form within the elementary cells. Summation over the electrical field connected therewith in all elementary cells results in a macroscopically measurable electrical voltage, from which the force-path progression can in turn be determined.

Also possible within the framework of the present disclosure is that the sensor device be configured as a resistive force transducer for acquiring a force-path progression acting in the connection interface. In resistive force transducers, the Ohmic resistance of the force transducer changes as a function of measuring variables such as length or temperature. The change in resistance leads to an altered voltage drop, which can be acquired, and from which the force-path progression can be determined.

In an alternative configuration of the present disclosure, the sensor device is configured as a potentiometric sensor for acquiring a force-time progression acting in the connection interface. A potentiometric sensor is an electrical resistance component, whose resistance values can be altered mechanically, for example by turning or shifting. A force progression can be determined based on the change in resistance.

Within the framework of the present disclosure, it is also possible for the sensor device to be configured as a strain gauge for acquiring the force-time progression acting in the connection interface. Strain gauges are measuring devices for acquiring stretching and compressive types of deformation. They already change their electrical resistance in response to slight deformations, so that the force-time progression can be determined.

It is alternatively possible for the sensor device to be configured as an inductive or capacitive sensor for acquiring the force-time progression acting in the connection interface. Inductive sensors are based on attenuating or changing the frequency of a resonant circuit or a coil, making it possible to determine the force-time progression. Capacitive force transducers are based on a change in the capacity of a capacitor. Given a change in capacity, a conclusion can be reached about the time-force progression.

In a preferred implementation of the present disclosure, the testing device includes a digital data processing device, for example a calculator or a computer. In particular, the control device and/or evaluation device are integrated into the digital data processing device and/or connected with the latter.

A preferred configuration of the present disclosure provides that the evaluation device evaluate the force-path progression acquired by the sensor device based on a desired force-path progression as an OK progression or Not-OK progression. Alternatively, the evaluation device evaluates the force-time progression acquired by the sensor device based on a desired force-time progression as the OK progression or the Not-OK progression.

The desired force-path progression or desired force-time progression is preferably filed and/or stored in the digital data processing device. As a result, the evaluation device can access the desired force-path progression or desired force-time progression to evaluate the acquired force-path progression or force-time progression.

In a preferred implementation of the present disclosure, the testing device includes a supplementary sensor device. For example, the supplementary sensor device is arranged on the tool, e.g., on a handle of the tool. Alternatively, the supplementary sensor device can be arranged on another suitable location of the testing device. The supplementary sensor device is preferably configured as at least one camera device. In particular, the camera device is configured for recording digital images of the connection interface. Within the framework of the present disclosure, it is preferred that the evaluation device evaluate the recorded image acquired by the supplementary sensor device based on a desired recording filed in the digital data processing device as an OK recording or as a Not-OK recording.

An especially preferred configuration of the present disclosure provides that the evaluation device transmit a Not-OK control signal to the control device if a Not-OK progression or Not-OK recording has been evaluated. During and/or after the transmission of the Not-OK control signal, the control device transmits a line stop of the assembly line, on which is arranged the connection interface of the first and second vehicle components for coupling. This advantageously creates the ability to recognize vehicle components having an erroneously coupled connection interface, making it possible to reconnect, or otherwise sort out the issue. As a result, the number of defective vehicle components can be tangibly reduced, and costs for repair work can be diminished.

Within the framework of the present disclosure, it is further preferred that the testing device include an adapter set with a plurality of test adapters. As another option, the testing device includes an interface set with a plurality of connection interfaces. Precisely one test adapter of the adapter set is preferably configured to test one or more of the connection interfaces of the interface set. In particular, precisely one connection interface or several specific connection interfaces of the interface set are allocated to one test adapter of the adapter set. Because the test adapter can be removed from the tool without a tool and/or without being destroyed and replaced with another test adapter, a product change, and hence interface change, can be responded to quickly. This makes it possible to economize on production time and costs.

In a preferred configuration of the present disclosure, each of the test adapters of the adapter set includes a transponder. The transponder is preferably integrated into the test adapter. In particular, the transponder is configured as an identification device for the respective test adapter. The transponder preferably sends out a signal when the test adapter is placed on the tool. This makes it possible to identify the test adapter and/or the accompanying connection interface to be coupled along with the desired force progression required in this process. As an additional option, the tool includes a reading device for reading out the information signal of the transponder. For example, the reading device is integrated into the tool, e.g., into the handle of the tool. The reading device is preferably connected with the transponder and evaluation device for signaling purposes. The reading device preferably reads out the information signal transmitted by the transponder, and transmits it to the evaluation device.

A preferred implementation of the present disclosure provides that, based upon the information signal, the evaluation device accesses the correct filed desired force-path progression or desired force-time progression for evaluating the desired force-path progression or desired force-time progression acquired by the sensor device. In particular, a specific/separate desired force-path progression or desired force-time progression is filed for each of the adapters and for each connection interface of the interface set.

Another possible subject matter of the application relates to an assembly line with the testing arrangement according to the preceding description.

A further subject matter of the present disclosure relates to a method for testing at least one connection interface with a testing arrangement according to the preceding description. The connection interface is coupled onto an assembly line between first and second vehicle components. The testing arrangement includes a tool, which couples the at least one connection interface. The testing arrangement includes at least one test adapter, which tests the connection interface when it is coupled. The testing arrangement includes at least one sensor device, which acquires a force progression that acts while coupling the at least one connection interface. The testing arrangement includes an evaluation device, which evaluates a force progression. The evaluation device preferably transmits the acquired force progression as a control signal to the control device. In particular, the control device actuates the assembly line based upon the control signal.

BRIEF DESCRIPTION OF THE DRAWINGS

The present disclosure will hereinafter be described in conjunction with the following drawing figures, wherein like numerals denote like elements.

FIGS. 3A and 3B illustrate alternative embodiments of the connection interfaces shown in FIGS. 1 and 2;

Corresponding or identical parts on the figures are all provided with the same reference number.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description.

Figure 1:
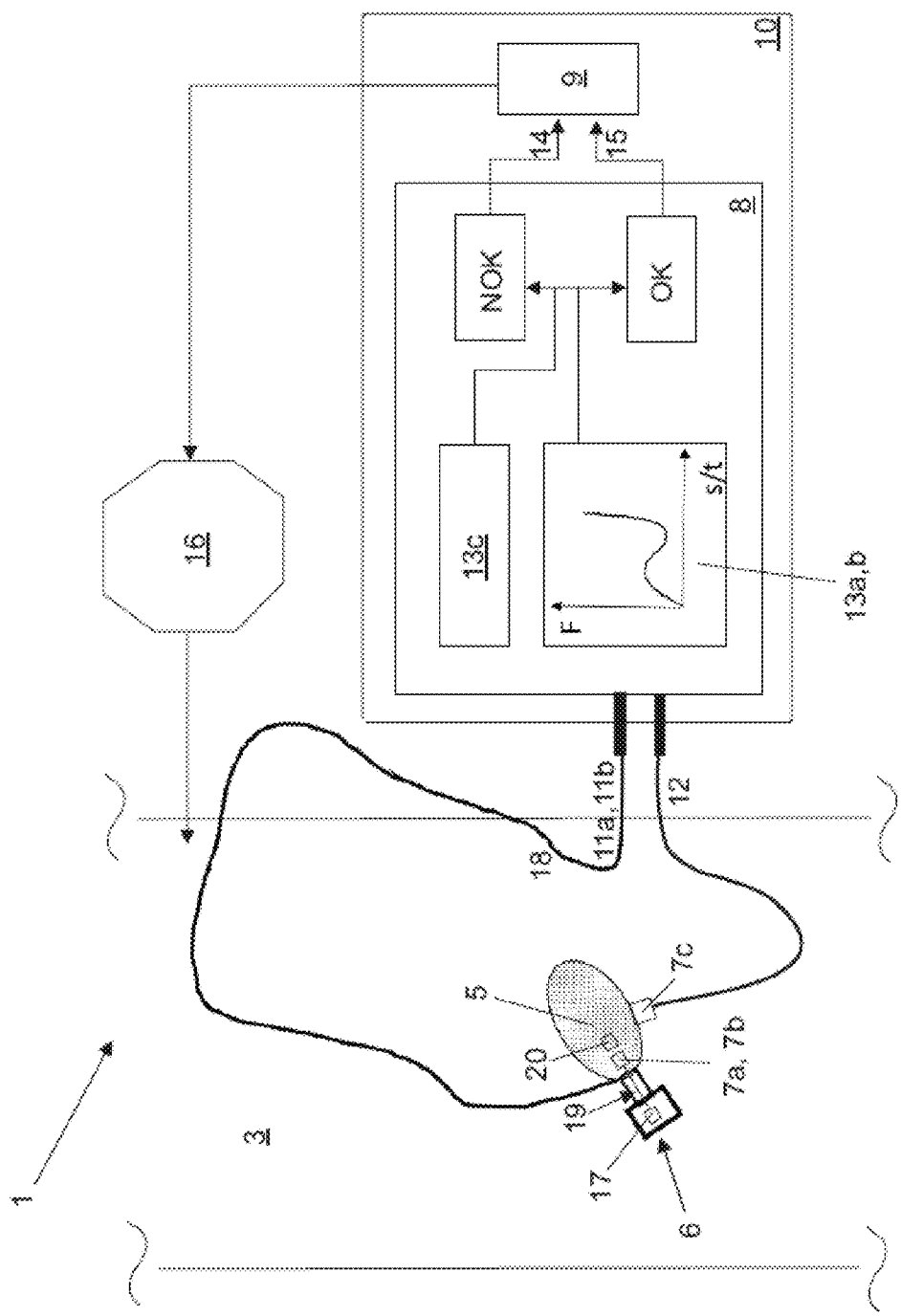
FIG. 1 A testing device for testing at least one connection interface of vehicle components.
Figure 2:
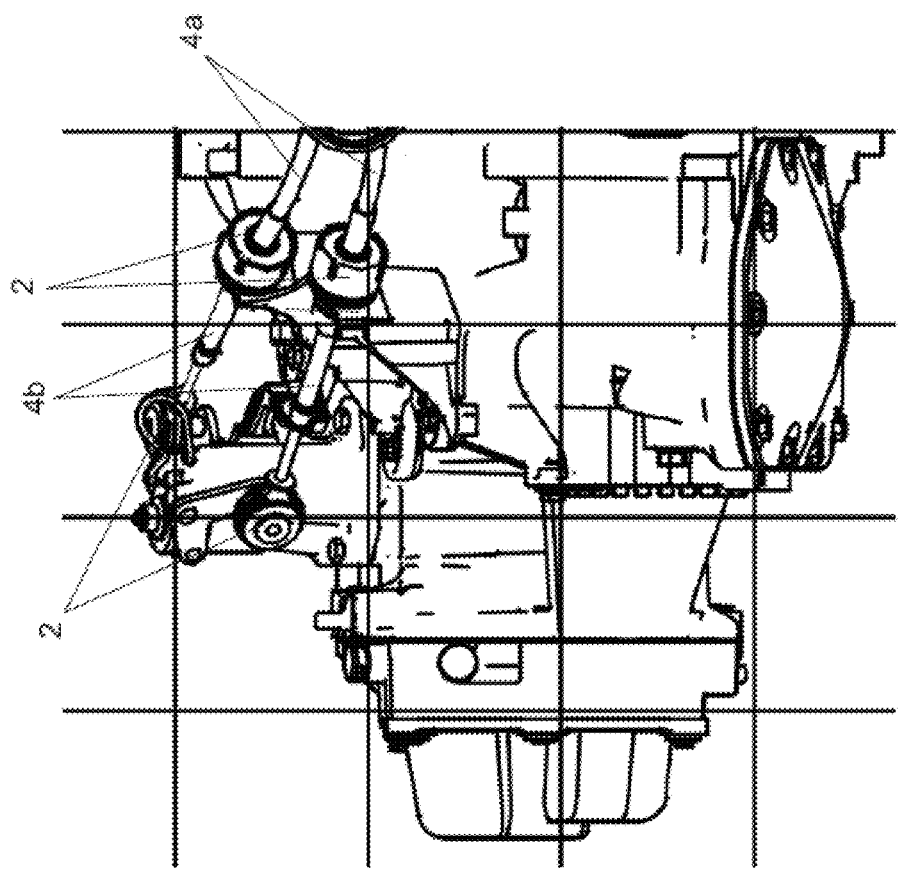
FIG. 2 The vehicle components from FIG. 1, wherein the vehicle components are coupled via the at least one connection interface.

FIG. 1 presents a schematic view of a testing arrangement 1. The testing arrangement 1 is configured for testing at least one connection interface 2 (FIG. 2). The connection interface 2 is coupled and/or can be coupled on an assembly line 3 of a production line between at least one first and one second vehicle component 4 (FIG. 2).

According to FIG. 2, the vehicle components 4a, 4b are configured as shift cables of a motor gearbox and/or shifter gearbox of a vehicle, in particular of an automobile or truck. Alternatively, the vehicle components 4a, 4b can be configured as lines in an engine cooling system and/or in a fuel system of the vehicle.

Figure 3B:
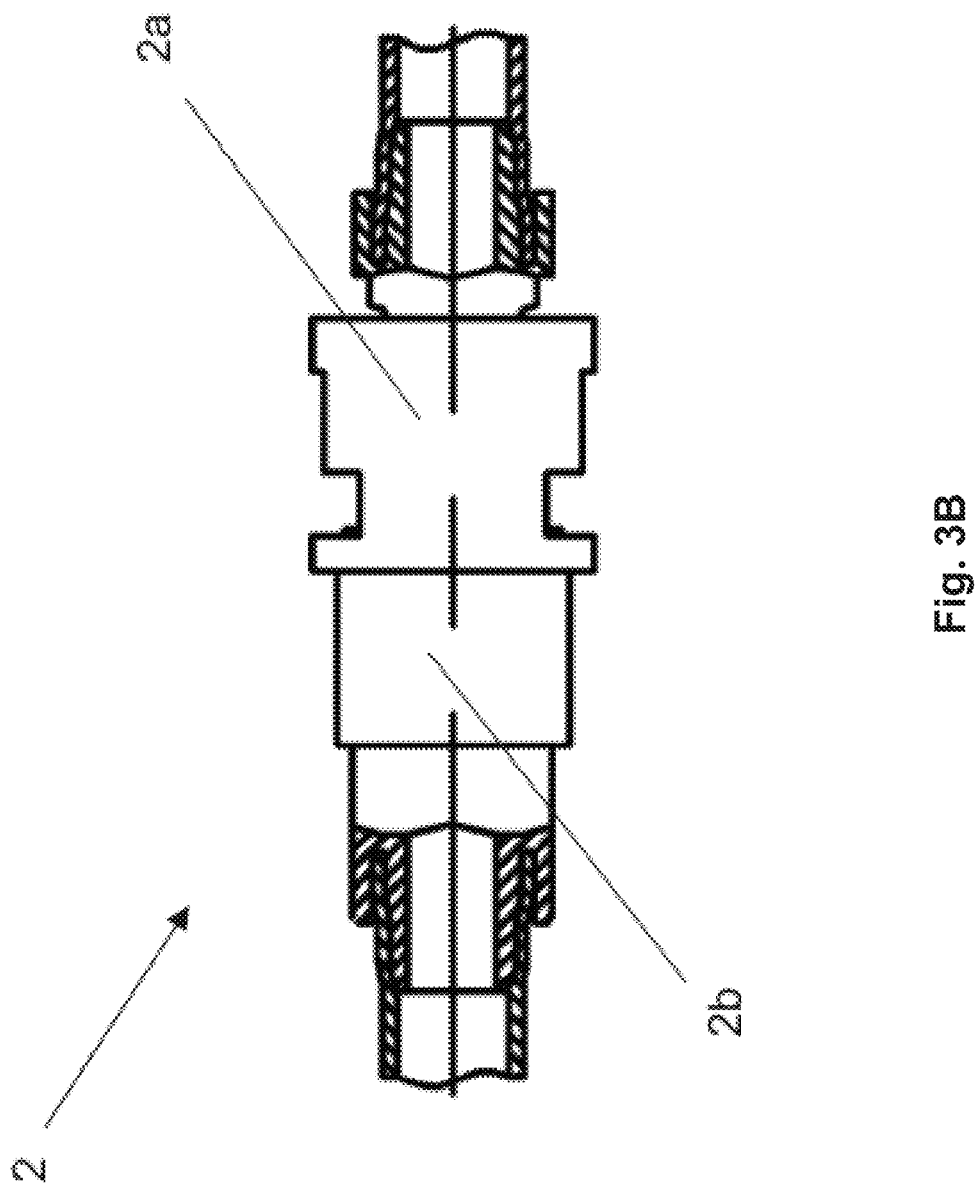

According to FIGS. 3A and 3B, the at least one connection interface 2 includes two interacting quick connector parts 2a, 2b. For example, the quick connector parts 2a, 2b are configured as snap connector parts. In particular, the at least one first and one second vehicle component 4a, 4b (FIG. 2) are coupled with each other and/or can be coupled with each other by means of the quick connector parts 2a, 2b. FIG. 3A shows the connection interface 2 with the quick connector parts 2a, 2b, which is configured to couple the lines in the engine cooling system. FIG. 3B shows the connection interface 2 with the quick connector parts 2a, 2b, which are used for coupling the lines in the fuel system of the vehicle.

Figure 4:
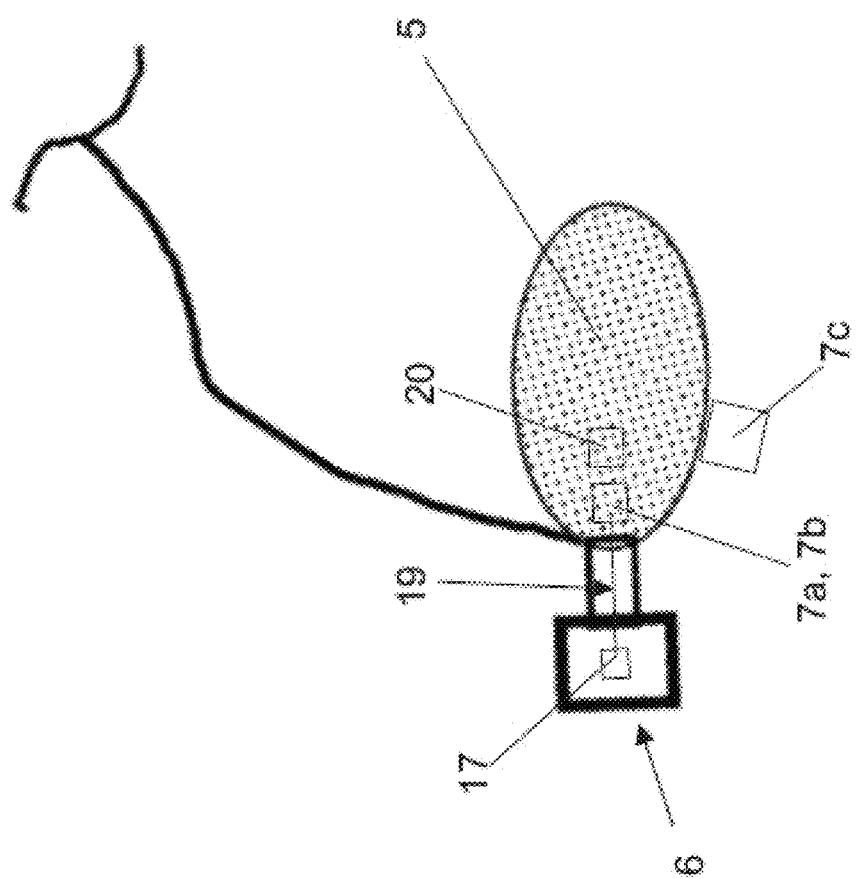
FIG. 4 A tool for coupling the connection interface and a test adapter arranged on the tool.

According to FIG. 1, the testing arrangement includes a tool 5. The tool 5 is magnified on FIG. 4. The tool 5 can be used to couple the at least one connection interface 2. For example, the tool 5 can be configured as a manipulator, gripper and/or effector of an industrial robot. Alternatively, the tool 5 can be configured as a manually operated tool.

According to FIG. 1, the testing arrangement 1 includes at least one test adapter 6, which is configured to test the coupling of the at least one connection interface 2. The test adapter 6 checks whether the two interacting quick connector parts 2a, 2b of the connection interface 2 are completely and safely coupled with each other, so that the vehicle components 4a, 4b can be used in the vehicle in a functionally reliable manner. As shown on FIG. 4, the at least one test adapter 6 is arranged on the tool 5, in particular can be placed and/or inserted thereon. In order to arrange the test adapter 6 on the tool 5, there is another quick connector between the tool 5 and the at least one test adapter 6, for example another snap connector. It is also possible to arrange the at least one test adapter 6 on the tool 5 by fastening it thereto with a screw or threaded fastener. The test adapter 6 can be detached from the tool 5 without any tools and/or without being damaged, and replaced by another test adapter 6.

In order to couple numerous different vehicle components 4a, 4b, the testing arrangement 1 includes an interface set with a plurality of connection interfaces 2 and an adapter set with a plurality of test adapters 6. A connection interface of the interface set is allocated to two respective vehicle components 4a, 4b to be coupled. Each connection interface 2 in turn has allocated to it precisely one test adapter 6 of the adapter set, so as to be arranged on the tool 5 and test the connection interface 2.

Figure 5C:
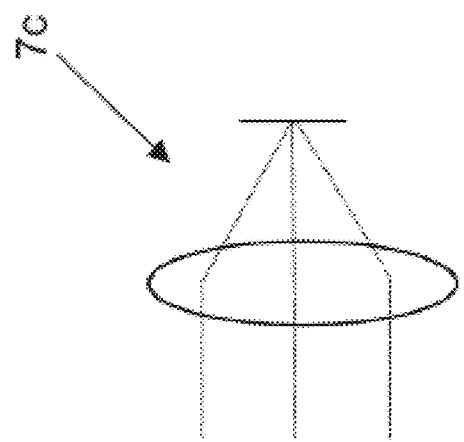
FIGS. 5A, 5B and 5C illustrate various embodiments of a sensor device for the test adapter shown in FIG. 4.
Figure 5B:
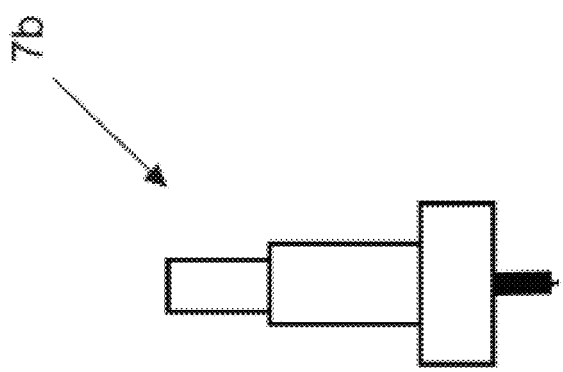
Figure 5A:
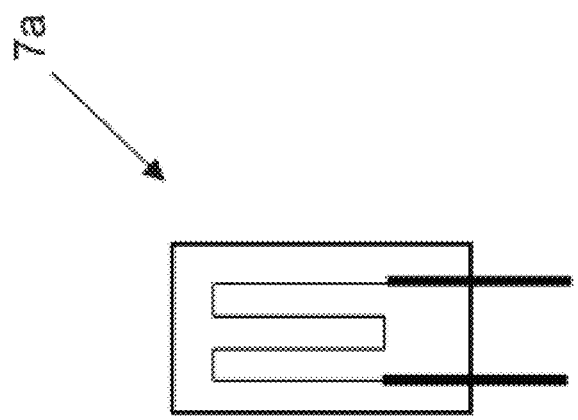

According to FIG. 1, the testing arrangement 1 includes at least one sensor device 7a, 7b. Possible embodiments of the at least one sensor device 7a, 7b are shown on FIGS. 5A and 5B. The sensor device 7a according to FIG. 5A and the sensor device 7b according to FIG. 5B are integrated into the tool 5, in particular into a handle of the tool 5. They acquire a force progression that acts in the at least one connection interface 2 during and/or after the coupling of the two quick connector parts 2a, 2b.

The sensor device 7a is configured to acquire a force-time progression 11a that acts while coupling the connection interface 2. For example, the sensor device 7a is configured as a potentiometric sensor, a strain gauge or an inductive or capacitive sensor.

The sensor device 7b is configured as a force-path measuring device for acquiring a force-path progression 11b upon and/or during coupling in the at least one connection interface 2. For example, the force-path measuring device is configured as a spring body force transducer, a piezo force transducer, or a resistive force transducer.

In order to transmit the force-time progression 11a and/or force-path progression 11b, the tool 5 includes a transmission device 19, e.g., a transmission rod. The transmission device 19 mechanically connects the test adapter 6 placed on the tool 5 with the sensor device 7a, 7b, so that the sensor device 7a, 7b can acquire the force-time progression 11a and/or the force-path progression 11b that acts upon coupling the corresponding connection interface 2. The advantage is that each of the test adapters 6 need not have its own sensor device 7a, 7b. This makes it possible to save on component costs for the test adapter 6.

The testing arrangement 1 optionally includes at least one supplementary sensor device 7c. According to FIG. 1 and FIG. 4, the latter is arranged on the tool 5, in particular on the handle of the tool 5. Alternatively, the at least one supplementary sensor device 7c can be arranged on a suitable different location of the testing arrangement 1 separately from the tool 5. According to FIG. 5C, the at least one supplementary sensor device 7c is configured as at least one camera device for visually acquiring the at least one connection interface 2. In particular, the connection interface 2 is recorded by the supplementary sensor device 7c and/or acquired as a recording 12.

The testing device 1 includes an evaluation device 8, a control device 9 and a digital data processing device 10. The evaluation device 8 and/or control device 9 are connected with the digital data processing device 10 and/or integrated into the latter. For example, the digital data processing device 10 is configured as a calculator and/or computer. The digital data processing device 10, in particular the evaluation device 8, has filed and/or stored in it a desired force-path progression 13b, a desired force-time progression 13a and/or a desired recording 13c for calibration with the acquired force-path progression 1b, force-time progression 11a or for calibration with the acquired recording 12.

Each of the test adapters 6 includes a transponder 17 for identifying the test adapter 6. The transponder 17 is integrated into the test adapter 6. The tool 5 includes a reading device 20, which is connected with the transponder 17 and evaluation device 8 for signaling purposes. For example, the reading device 20 is integrated into the handle of the tool 5. When the respective test adapter 6 is arranged on the tool 5, the transponder 5 transmits an information signal 18 to the reading device 20. The reading device 20 reads out the information signal 18, and transmits it to the evaluation device 8. The evaluation device 8 can use the information signal 18 to perform the evaluation based upon the correct desired force-path progression 13a or desired force-time progression 13b for the attached test adapter 6 and corresponding connection interface 2 to be coupled, and as an additional option based upon the correct desired recording 13c.

The evaluation device 8 evaluates the force-time progression 11a acquired by the at least one sensor device 7a based on the filed desired force-time progression 13a as an OK progression OK or as a Not-OK progression NOK. As an alternative or additional option, the evaluation device 8 evaluates the force-path progression 11b acquired by the sensor device 7b based on the filed desired force-path progression 13b as the OK progression OK or as a Not-OK progression NOK.

As an additional option, the evaluation device 8 evaluates the recording 12 based on a filed recording 13c as an OK recording OK or as a NotOK recording NOK. When evaluating the NotOK progression NOK and, as an additional option, when evaluating the NotOK recording NOK, the evaluation device 8 transmits a NotOK control signal 14 to the control device 9. The latter thereupon initiates a line stop 16 of the assembly line 3. If the evaluation device 8 evaluates an OK progression OK or an OK recording OK, it transmits an OK control signal 15 to the control device 9. The control device 9 allows the assembly line 3 to continue running without a line stop 16.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the invention as set forth in the appended claims and their legal equivalents.

What is claimed is:

1. A testing arrangement in an assembly line for testing at least one connection interface between first and second vehicle components, the testing arrangement comprising:
   a tool configured to couple a first connector of the connection interface associated with the first vehicle component to a second connector of the connection interface associated with the second vehicle component, the tool comprising a transmission device;
   at least one test adapter configured to be coupled to the transmission device of the tool;
   at least one sensor device mechanically connected to the test adapter via the transmission device, the transmission device configured to transmit a force progression by the tool on the connection interface when the tool couples the first connector to the second connector from the test adapter to the at least one sensor; and
   an evaluation device communicatively coupled to the at least one sensor device configured to evaluate when the tool correctly coupled the first connector to the second connector of the connection interface based upon the force progression.

2. The testing arrangement according to claim 1, wherein the at least one sensor is configured to acquire the force progression after coupling of the connection interface.

3. The testing arrangement according to claim 1, wherein the evaluation device is configured to evaluate the force progression acquired by the at least one sensor device based on a predetermined force progression as an "OK progression" or as a "NotOK progression."

4. The testing arrangement according to claim 3, wherein the force progression comprises a force-path progression and the at least one sensor device being at least one member of the group including a spring body force transducer, a piezo force transducer or a resistive force transducer.

5. The testing arrangement according to claim 3, wherein the force progression comprises a force-time progression and the at least one sensor device being at least one member of the group including a potentiometric sensor, a strain gauge, an inductive sensor, or capacitive sensor.

6. The testing arrangement according to claim 3, wherein the testing device further comprises a control device configured to actuate the assembly line, wherein the evaluation device transmits a NotOK control signal to the control device when evaluating a NotOK progression and the control device initiates a line stop of the assembly line in response to the NotOK control signal.

7. The testing arrangement according to claim 6, wherein the testing device comprises a digital data processing device including the evaluation device and the control device connected therewith, wherein the desired force progression is stored in the digital data processing device.

8. The testing arrangement according to claim 1, wherein the testing arrangement further comprising at least one supplemental sensor device configured to record the at least one connection interface.

9. The testing arrangement according to claim 8, wherein the at least one supplemental sensor comprises a camera.

10. The testing arrangement according claim 8, wherein at the at least one sensor device and the at least one supplemental sensor device is arranged on the tool.

11. The testing arrangement according to claim 8, wherein the evaluation device is configured to evaluate the recording acquired by the at least one supplementary sensor device based on a predetermined recording as an "OK recording" or as a "NotOK recording."

12. The testing arrangement according to claim 1, wherein the vehicle components being at least one member of the group including shift cables of a motor gearbox, cable of a shifter gearbox of a vehicle, lines in an engine cooling system or lines in a fuel system of the vehicle.

13. The testing arrangement according to claim 1, wherein the testing device further comprises an adapter set having a plurality of test adapters and an interface set with a plurality of connection interfaces, wherein each of the test adapters is configured to check the coupling of precisely one of the connection interfaces.

14. The testing arrangement according to claim 13, wherein each of the test adapters of the adapter set is arranged on the tool with a detachable connection that is removable therefrom without another tool and without being damaged, so that the test adapter is replaceable with a suitable test adapter from the adapter set given a change in at least one of the vehicle components or connection interface.

15. The testing arrangement according to claim 13, further comprising:
- a transponder associated with each of the test adapters of the adapter set for identifying the respective test adapter arranged on the tool; and
- a reading device associated with the tool for reading out an information signal of the transponder;
- wherein the transponder is configured to transmits the information signal to the reading device, the reading device is configured to read out and transmits the information signal to the evaluation device, the evaluation device is configured to recognize the test adapter arranged on the tool and the corresponding connection interface based on the information signal and use the predetermined force progression for evaluation purposes.

* * * * *